United States Patent
Baur et al.

(10) Patent No.: US 6,774,656 B2
(45) Date of Patent: Aug. 10, 2004

(54) SELF-TEST FOR LEAKAGE CURRENT OF DRIVER/RECEIVER STAGES

(75) Inventors: Ulrich Baur, Weil im Schoenbuch (DE); Otto Andreas Torreiter, Leinfelden-Echt (DE); Joseph Eckelman, Hopewell Junction, NY (US); David TinSun Hui, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 212 days.

(21) Appl. No.: 09/682,924

(22) Filed: Nov. 1, 2001

(65) Prior Publication Data

US 2002/0079915 A1 Jun. 27, 2002

(30) Foreign Application Priority Data

Nov. 1, 2000 (DE) .......................... 001 23 770

(51) Int. Cl.[7] .............................. G01R 31/26
(52) U.S. Cl. ...................................... 324/765
(58) Field of Search .................. 324/73.1, 763, 324/765, 158.1

(56) References Cited

U.S. PATENT DOCUMENTS 3,621,387 A * 11/1971 Smith et al. ............... 324/73.1
5,321,354 A * 6/1994 Ooshima et al. ........... 324/765
5,742,177 A * 4/1998 Kalb, Jr. .................... 324/765

* cited by examiner

Primary Examiner—Kamand Cuneo
Assistant Examiner—Russell M. Kobert
(74) Attorney, Agent, or Firm—Anthony J. Canale

(57) ABSTRACT

The present invention relates to a test for current leakage of driver/receiver stages, and in particular for bi-directional input/output stages (10) of a semiconductor chip. Two dedicated support transistor devices (56, 58) are added into the prior art switching scheme, together with a simple control logic (48, 50, 52, 60, 62, 64) for selectively controlling the two dedicated support transistor devices according to a predetermined test scheme. An on-chip self-test feature provides valid voltage levels which are convertible by the receiver (24) to predictable logic states at the evaluation line RDATA. The test can be performed autonomously on the chip without the requirement for an external test device.

20 Claims, 2 Drawing Sheets

(a)

(b)

SELF-TEST FOR LEAKAGE CURRENT OF DRIVER/RECEIVER STAGES

BACKGROUND OF THE INVENTION

Field of the Invention

The present invention relates to a method and system for providing a test for leakage current for driver/receiver stages, and in particular for bi-directional input/output stages of a semiconductor chip.

BACKGROUND OF THE INVENTION

The testing of semiconductor chips in general is a very complex task because test devices must be fine enough in order to be coupled to the enormous number of chip signal input/output pins which are available to test the chip with a given test scheme.

Current and next generation semiconductor product chips have an increasingly large number of signal I/O stages to achieve the performance and complexity requirements imposed by the specific technical progress intended with each new generation. This trend, in conjunction with the required high quality of the products, results in the need for very costly test equipment to reach all of the signal input/output stages at the tester in order to have the stages tested adequately.

Adequate testing includes testing for input/output leakage current of driver/receiver stages of an I/O stage.

The above mentioned test equipment required for the adequate testing is large and expensive. In particular, the coupling between test apparatus and chip is difficult because of the enormous number of I/O stages to be tested. Nearly each new chip generation requires a new expensive test apparatus in particular to test the quality of the I/O stages.

In order to simplify chip testing in general, and in particular the testing of the driver and receiver capability, a method was introduced, the so-called "reduced pin test method". The basic idea used in this prior art approach is to couple an intermediate, connective device having a reduced number of pins between the test apparatus and the chip to be tested. The testing scheme was then a 'structurized scheme', i.e., a scheme in which a selectively chosen subset of chip signal I/Os connected to the low pin count test apparatus and a specific set of test patterns, applied only to this test I/O interface was decided to be sufficient to test the respective chip and in particular by having the unconnected signal I/Os testing themselves by receiving their own driven value.

A prior art I/O stage is described below with reference to FIG. 1 in order to show the prior art situation and the problems associated with it.

FIG. 1 shows a simplified scheme of a prior art bi-directional signal I/O stage 10 having a built-in 'digital' self-test feature by which minimum qualitative properties of driver 18/receiver 24 system can be tested by driving both values '0' and '1' to node 14 (generally a connective pad denoted as PAD in the figures) and by receiving it correspondingly in receiver 24 and signal line 26 RDATA.

This kind of self-test, however, is of limited coverage only because it does not tell anything about the 'analog', i.e., the electrical properties of the I/O stage and, in particular, nothing about the leakage current between off-chip connective node 14 and supply voltage VDD, or ground, or any other relevant voltage potential.

I/O stage 10 further consists of signal line 12 DDATA as a signal input representing the logical data value ('0' or '1') which has to be driven out by driver logic 18 to node 14 denoted as PAD as the off-chip connection thereof. Signal line 16 carries a signal denoted as ACT which is the signal input used for ACTivating and turning off the driver when signal I/O stage 10 has to be in receive mode. P-type 20 and N-type 22 output stage field effect transistors, referred to herein and denoted in the drawing as P and N (FETs) are connected to node 14 PAD.

The P and N transistor devices depicted in FIG. 1 are illustrated in a simplified way only, in order to improve clarity. In reality, each device 20 and 22 consists of a number of single transistors, which is in turn often called a 'signal driver'.

Receiver device 24 denoted as 'rec' converts the voltage levels applied at node 14 PAD to logical '0' and '1' values at signal line 26 denoted as RDATA often further connected to a Master/Slave latch. Having implemented the limited self-test capability, signal I/O stage 10 receives its own driven output signal. In this situation where the signal I/O stage receives its own driven output signal by having the driver in low impedance mode, a potential defect causing leakage paths or erroneous driver high impedance, i.e. OFF state, behavior may not be detected explicitly.

In particular, the off-chip connection PAD is not fully tested for leakage paths to VDD, GND or any other potential, nor can a defect, causing a low impedance at the P or N device, be detected when it should be in high-impedance mode, abbreviated herein as HZ-mode. Whenever the signal I/O stage is in HZ-mode, the resulting voltage level at PAD is unpredictable, i.e. floating, so that no valid logical expect value at signal evaluation line 26 RDATA can be defined to be tested for.

BRIEF SUMMARY OF THE INVENTION

It is thus an object of the present invention to improve the testing of driver and that of receiver stages, and in particular that of combined stages, and in particular that of chip I/O stages.

According to its broadest aspect, the present invention provides a method for qualifying a leakage current to be tolerable or not, the leakage current being present in a test area of a hardware circuit, and in particular of a driver/receiver stage, or input/output stage, respectively, which consists of the test area between a first tap node, and a second node being able to be forced to a voltage potential of a value, ie. ground, or supply voltage level Vdd, or any other predetermined voltage level. The method consists of the steps of: a) shutting off any operational current inflow into the test area, b) generating an evaluable voltage difference between the first tap node and the second node, the voltage difference being characteristic for the leakage current, c) qualifying the leakage current as tolerable in dependence of the resulting voltage at the first tap node. The characteristic voltage difference can be a voltage drop in a test path consisting of a specifically added switching element acting as an Ohm-resistor such as a transistor switched in pass mode having a predetermined operational resistivity and the test area connected in series to the resistor.

A key idea of the present invention is thus to provide an on-chip self-test feature, which provides valid voltage levels at the off-chip connection node PAD for a good device, which are convertible by the receiver to predictable logic states at the evaluation line RDATA. In the case of a current leakage or a HZ fail, the voltage level at PAD will not meet this requirement and will lead to a mismatch of the logical value expected at the signal line RDATA.

Advantageously, this can be done as follows. Two dedicated support transistor devices are added into the prior art switching scheme together with a simple control logic for selectively controlling the two transistors according to a predetermined test scheme to be performed autonomously on the chip without any test device external to the chip being required. The test input is fed via input lines into the control logic and the test result can be read from a result signal line.

The first of the two support devices is denoted as 'support device Up' and abbreviated as SDU, whereas the second support device is denoted as 'support device down', further abbreviated as SDD. Both devices are transistors of small size, the resistivity parametrics of which are defined as a function of the maximum allowed leakage current, further referred to as 'Ileak' (max) and as a function of the predetermined 'receiver rec' voltage levels, further referred to herein as MPDL (Most Positive Down Level) and 'LPUL' (Least Positive Up Level) including a respective predetermined guardband thus yielding the V PAD voltages VL=MPDL−guardband and VH=LPUL+guardband.

In the case of an intolerable leakage current on a path from PAD to GND or PAD to VDD greater than |Ileak max|, or in the case of a HZ-defect causing either the N-device or the P-device to not be completely shut off, the resulting voltage on V PAD will be greater than LPUL or smaller than MPDL such that the receiver will convert these failure-indicating voltage levels on the signal line RDATA to the opposite logical value of what is expected chip-internally and the test will fail.

The advantages are as follows:

An I/O Leakage Self-test is provided without the need of a tester connection to the pad node even in case of a reduced pin count test chip technology.

Further, this inventive principle automatically covers the high impedance (HZ) test of the signal I/O stage under test.

Further, the self-test can be achieved with a simple test scheme, applied only to the test input/output signal lines.

Further, the test can be applied at low speed and thus there is no need for high performance test equipment.

Further, the test can be applied at every packing level: at wafer level, on a single-chip module (SCM) or on a temporary chip attach (TCA), on a multiple chip module (MCM), and even at system level, when the chip is incorporated into a printed circuit board connected to whatever bus system. In the latter case, advantageously a dedicated piece of system software can be executed which controls the hardware logic according to the test scheme so as to perform the inventive test method. The software might be run triggered by service staff, or in any automated form.

BRIEF DESCRIPTION OF THE SEVERAL VIEWS OF THE DRAWINGS

The present invention is illustrated by way of example and is not limited by the shape of the figures of the accompanying drawings in which.

DETAILED DESCRIPTION OF THE INVENTION

Figure 1:
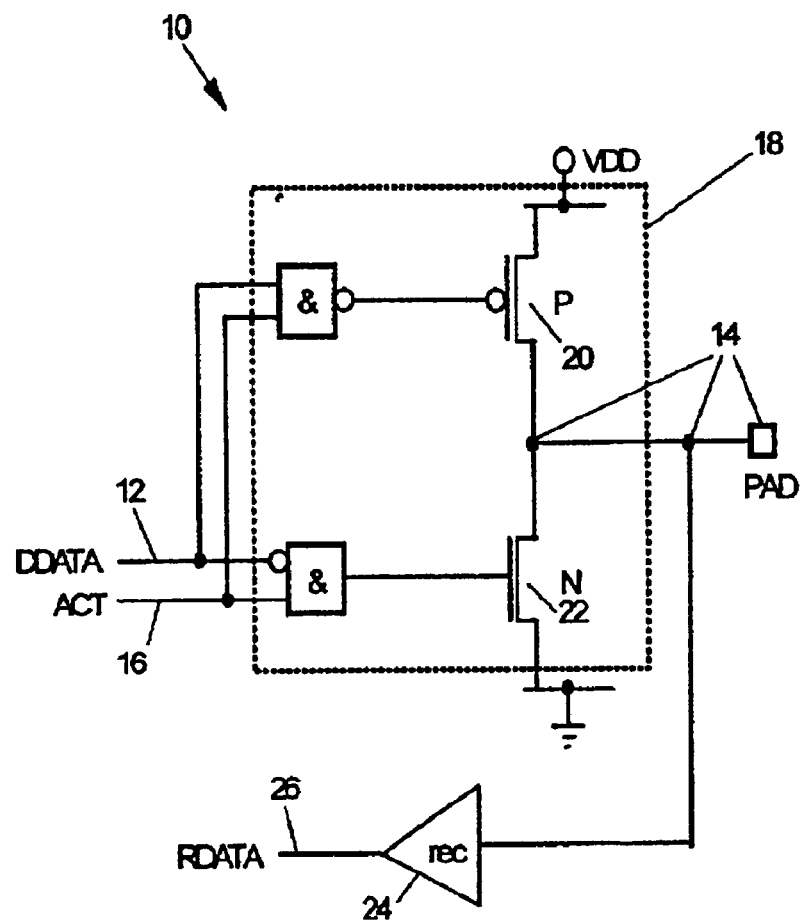
FIG. 1 is a simplified schematic logical representation of an exemplary implementation of a prior art bi-directional signal Input/Output stage, FIG. 2(a) includes a simplified representation of an exemplary implementation of a combined Input/Output stage with integrated leakage current and Driver HZ self-test facility according to an inventive embodiment.
Figure 2:
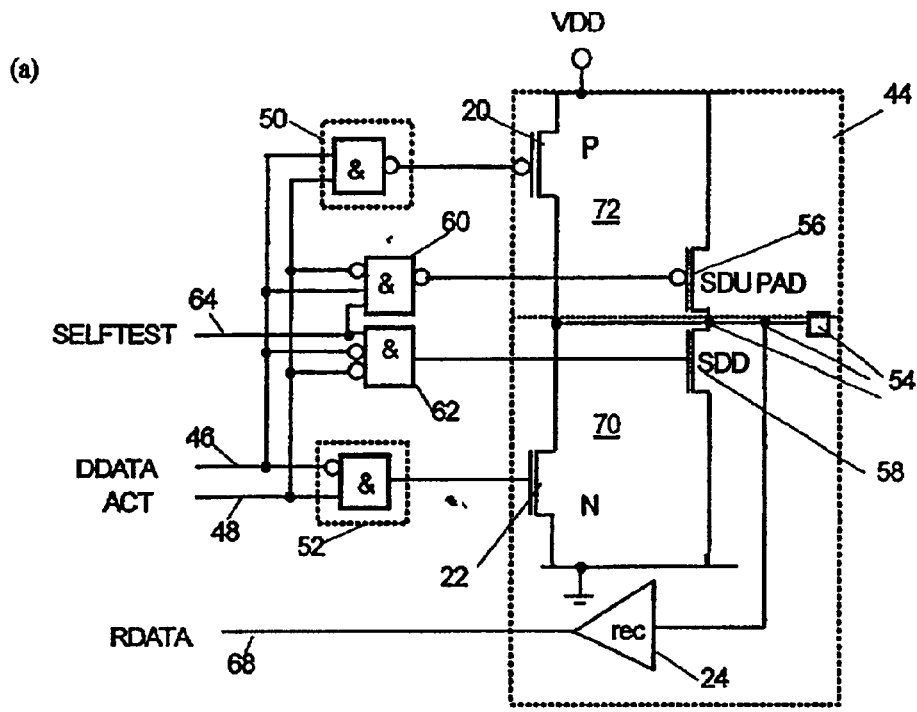
FIG. 2(b) shows a receive hysteresis of a receiving device.
Figure 2:
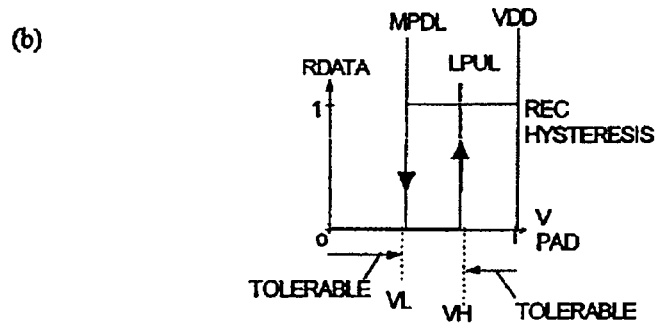

With special reference to FIG. 2(a), the P-device transistor and the N-device transistor are depicted with reference sign 20 and 22, respectively, connected in series between supply voltage VDD and ground.

In order to be able to qualify the input/output stage to be tolerable or not in of a leakage current being too large or in terms of the existence of an erroneous driver-HZ state, driver devices 20 and 22 must be shut-off such that no operational current flows between VDD and ground. In other words, when there is no operational current inflow into test region 44, two respective sub-portions further referred to as two test areas 70, 72 constituting region 44 can be tested subsequently for the above mentioned purposes according a predetermined test scheme.

In order to perform this test, the gate terminal of each transistor device 20 and 22 is controlled by a respective gate control signal. Both gate control signals are generated from input signals DDATA 46 and ACT 48, and corresponding AND-gates 50 and 52. Activation signal 48 is implemented to have the value '1' when a driver test shall be performed whereas signal 46 DDATA reflects the two different operational driver states '0' and '1', respectively, but a value '0' at activation signal 48 turns off (high impedance) both devices 20 and 22 to enable the leakage test mode.

In order to generate an evaluable voltage difference, i.e. a voltage drop between a fixed-potential node VDD or ground, and first tap node PAD 54, the voltage drop being considered to be characteristic for a leakage current to be tested for, a pair of high-resistive transistors 56 and 58, respectively denoted as SDU and SDD, are connected in series between supply voltage VDD and ground, and in parallel with devices 20 and 22. When transistors 56 and 58 are controlled to be in a high-resistive pass mode, a voltage drop can be generated by either of the two support devices. The gate terminal of devices 56 and 58 is controlled by a control signal generated by corresponding AND-gates 60, 62.

The input into AND-gates 60, 62 is as follows:

SELFTEST signal 64 is fed into both AND-gates 60, 62 which when SELFTEST signal 64 is a '1' enables the self-test mode. When SELFTEST signal 64 is a '0', basically the regular operation of the I/O stage can be performed.

Further, above mentioned activation signal 48 (ACT) is fed in an inverted form into AND-gates 60, 62. Signal 46 (DDATA) is fed into AND-gate 60 and in an inverted form into AND-gate 62, so that, depending on the state of signal 46, the one or the other of the devices 56 and 58 are set into the high resistive pass mode.

Receiver 24 is connected to tap node 54 (PAD) between support devices 56 and 58. Output RDATA 68 of receiver 24 is written according to the voltage level applied at tap node 54 (PAD) and can be captured into a latch or fanned out to the test for further test result evaluation.

A preferred embodiment of the inventive self-test method will now be described in more detail with the switching scheme described above and with special respect to the receive hysteresis of receiving device 24 which is depicted in FIG. 2(b), whereby a hysteresis must not necessarily been given, which means that MPDL can be equal to LPUL.

In brief terms, each support device is controlled via an AND gate, connected to three different signal lines ACT= driver inhibit, DDATA=data signal, and SELFTEST.

The one or the other support device is switched ON if ACT=0, SELFTEST=1 and specifically depend on the state of DDATA with DDATA=0 results in SDD=ON, and DDATA=1 results in SDU=ON. For any other signal combination the support devices are switched OFF.

In particular, when an initial value of '0' is applied at receiving device 24, a voltage larger than the least positive up-level (LPUL) must be applied at its input (ie. at tap node 54) to change its output RDATA 68 to a '1'. It should be noted that tap node 54 is depicted in triple form but can be regarded as having the same voltage potential all the time. Further, when a value of '1' is applied at receiving device 24, a voltage smaller than the most positive down level (MPDL) must be applied at its input to change its output to a '0'.

For the test purposes of the present embodiment, signal RDATA is intended to reflect the test result. In particular, when an input/output stage is considered to be of intolerable quality, signal RDATA is intended to be different from signal DDATA. In the case where both signals DDATA and RDATA have the same value, the input/output stage is considered to be of tolerable quality.

The following input pattern application sequence is now proposed to be applied as an input for the control signals SELFTEST 64, DDATA 46 and ACT 48. First, DDATA is '1', SELFTEST is '0' and ACT is '1'. With reference to Table 1, an x-value for input means 'non-relevant', whereas an x-value for output means 'undefined'. The before-mentioned value setting is depicted by the second column shown in Table 1.

TABLE 1

|  | 1 | 2 | 3 | 4 | 5 |
|---|---|---|---|---|---|
| ACT | 0 | 1 | 0 | 1 | 0 |
| SELFTEST | 0 | 0 | 1 | 0 | 1 |
| DDATA | x | 1 | 0 | 0 | 1 |
| V PAD | float | ~VDD | 0V..VL | ~0V | VH..VDD |
| RDATA | x | 1 | 0 | 0 | 1 |

In this situation, P-device 20 is switched into pass mode, N-device 22 is switched into lock mode, and support devices 56 and 58 are in lock mode as well. Thus, a resulting 'initial' voltage near supply voltage VDD can be measured at tap node 54 leading to a value of '1' at the output of receiver device 24 as RDATA signal 68.

Then, SELFTEST signal 64 is switched from '0' to '1' and ACT signal 48 is also switched, but from '1' to '0', as shown in the third column of Table 1. This means that P-device 20 is now shut-off and with signal DDATA 46 having a value of '1', AND-gate 62 is closed because DDATA '1' is inverted before entering into AND-gate 62.

As is described above, AND-gate 60 generates an output of '1' which is inverted after being output and applied to the gate input of SDU-device 56. Thus, SDU-device 56 is switched into pass mode. As the output of AND-gate 62 is a '0', support device 58 (SDD) is switched off which still keeps node 54 at the initial state. Then, finally in the sequence, DDATA is switched from '1' to '0' so that SDU-device 56 is now switched off and SDD device 58 is switched into pass mode.

Thus, a resulting test current flows from test area 72 of test region 44 shown in FIG. 2(a), through support device 58 to ground. Thus, the SDD-design and test area 72 is connected in series and build up a characteristic voltage divider which is tapped at tap node 54. When the leakage current is too large for the input/output stage to be qualified as tolerable, a voltage drop to VDD would be generated from the leakage current which would prevent receiver 24 from detecting a tolerable voltage of less or equal VL at tap node 54.

According to the present invention, the resistance of support device 58 and that of support device 56 is dimensioned such that according to the quality requirements, i.e. the quality specifications of the input/output stage, the voltage resulting from the test voltage drop is evaluated such that it defines a tolerable range when the test voltage drop is less than VL as shown in FIG. 2(b) which is a voltage level resulting from MPDL minus a certain, predetermined guard-band. This reflects the need of the receiver hysteresis behavior having to be considered with the test result.

Thus, with the scheme described above, test area 72 representing some portion of test region 44 is tested for I/O leakage current and erroneous driver-HZ which results in a leakage current, as well.

It should be noted that potential leakage defects at receiver area 24 which are part of region 44 in FIG. 2(a), are covered too. Areas 70 and 72 should be understood herein as 'examples' for potential defect areas.

Then, for building up a similar test scheme for remaining test area 70, refer to column 4 of Table 1. DDATA is kept at '0', ACT is switched to '1' and SELFTEST to '0' to apply the opposite initial state '0' on node 54 by having devices 20, 56 and 58 in lock mode and device 22 in pass mode.

In the case of ACT='0', SELFTEST='1' and later on in the sequence DDATA='1', as shown in column 5, AND-gate 60 outputs a '0' after inversion and sets support device 56 (SDU) in pass mode whereas device 22 is set into lock mode. Support device 58, however, is set into lock mode because now AND-gate 62 outputs a '0'. Thus, a test current now flows from VDD through support device 56 into test area 70.

The larger the leakage current through test area 70, the larger the voltage drop over support device 56 caused by the leakage current. Thus, when the leakage current is very small and thus support device 56 quality is good, i.e. tolerable, a voltage would result on node 54 which is quite close to VDD. Accordingly, the leakage current can be qualified as being too high and thus the input/output stage could be qualified as being not tolerable when a voltage results at node 54 which is smaller then VH as it is depicted in FIG. 2(b). VH in turn is defined as the voltage level LPUL plus the same guardband as described before. Thus, in the case of intolerable quality due to a leakage current found to be too large, a low voltage, i.e. less than VH would result at node 54 and would prevent receiver device 24 output from changing from a value of '0' to a value of '1'. Thus, in order to have correct test conditions, receiver device 24 must output a '1' at RDATA 68.

In order to clarify the pattern application sequence and the resulting states at node 54 and RDATA, reference is again made to Table 1. The upper portion of Table 1 denotes the input section of the switching scheme depicted in FIG. 2(a). The bottom portion of Table 1 consisting of the voltage at node 54 V PAD and signal 68 RDATA describes the result section of the switching scheme. The first column describes an input state sequence which results in a floating voltage state retrievable on node 54 PAD. In this situation no evaluable value can be found out in the evaluation signal RDATA.

Column 3 and column 5 represent the test situation in which column 3 reflects the test situation when test area 72 is tested, and column 5 reflects the test of the occurrence of a leakage current in test area 70.

Column 2 and column 4, reflect the regular operational mode of the switching scheme characterized by SELFTEST signal 64 having the value of '0', as well as the initial states in the test application sequence whereby column 3 has to be applied column 2 and column 5 after column 4.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

In particular, the control logic required for supplying support devices 56 and 58 may be implemented differently corresponding to a specific situation being present on a respective chip.

The present invention can be realized in hardware, software, or a combination of hardware and software. A testing tool according to the present invention can be realized in a centralized fashion in one computer system, or in a distributed fashion where different elements are spread across several interconnected computer systems. Any kind of computer system or other apparatus adapted for carrying out the described herein is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods.

Computer program means or computer program in the present context mean any expression, in any language, code or notation, of a set of instructions intended to cause a system having an information processing capability to perform a particular function either directly or after either or both of the following a) conversion to another language, code or notation;
b) reproduction in a different material form.

What is claimed is:

1. A method for qualifying a leakage current to be tolerable, the leakage current being present in a first test area of an integrated circuit, the method comprising the steps of:
    a) providing a first node coupled to said first test area, a second node coupled to a predefined voltage potential, and a receiver device having an input, an output and a threshold voltage level associated with the input for switching the output from a first state to a second state,
    b) shutting off any operational current flow into said first test area,
    c) generating a first voltage level at said first node corresponding to said leakage current, and
    d) qualifying said leakage current as tolerable when said first voltage level is between the threshold voltage level and the predefined voltage potential.

2. The method according to claim 1, wherein said leakage current flows in a test path comprising a switching element acting as an Ohm-resistor having a predetermined operational resistance, and said first test area being connected in series to said resistor.

3. The method according to claim 2, wherein said resistor is a transistor switched in pass mode.

4. The method according to claim 1, wherein said first node is a tap node between two transistors of a driver stage, forming a voltage divider.

5. The method according to claim 4, wherein a test region comprising said first test area and a second test area includes said receiver device of a combined driver/receiver stage of a semiconductor chip.

6. The method according to claim 5, wherein said test region is used for qualifying and/or quantifying the leakage current in a signal input/output stage of a semiconductor chip.

7. The method according to claim 1, wherein said first node is coupled to the input of the receiver device.

8. The method according to claim 7, wherein when said leakage current is qualified as tolerable, the output of said receiver device switches from the first state to the second state.

9. The method according to claim 1, wherein when said first voltage level is not between the threshold voltage level and the predefined voltage potential, qualifying said leakage current as not tolerable.

10. An integrated circuit for qualifying a leakage current to be tolerable the integrated circuit comprising:
    a) a leakage test area, a first node, a second node coupled to a predefined voltage potential and a receiver device having an input and an output, a threshold voltage level associated with the input for switching the output from a first state to a second state,
    b) a first device for shutting off any operational current flow into at least said leakage test area,
    c) a second device for generating a first voltage level at said first node corresponding to said leakage current and
    d) a third device for qualifying said leakage current as tolerable when said first voltage level is between the threshold voltage level and the predefined voltage potential.

11. The integrated circuit according to claim 10, wherein said first node is implemented as a tap node of a voltage divider.

12. The integrated circuit according to claim 11, wherein said voltage divider comprises a first and a second transistor connected in series, and said tap node is connected between the drain of the first transistor and the source of the second transistor, the gate of each of said first and second transistors being connected to selectively run two different test modes, in each of which a respective other transistor is switched in pass mode and forms part of the test path when the respective other transistor is switched in lock mode.

13. The integrated circuit according to claim 12, wherein the circuit is arranged as a combined input/output stage of a semiconductor chip having a driving P-device comprising a plurality of P-type transistors and a driving N-device comprising a second plurality of N-type transistors, said driving P-device and said driving N-device being connected in series between a first voltage level and a second voltage level, said drive devices driving high, low, and HZ states to a terminal pad connecting off from the semiconductor chip, the circuit further comprising the receiver device connected in parallel to said terminal pad, wherein when an electrical resistance of one of said first and second transistors in pass mode is implemented as R=(VDD−VH)/Ileak (max), where R represents the electrical resistance of said one transistor in pass mode, VDD represents the supply voltage, VH represents a voltage at said pad terminal, and Ileak (max) represents a maximum allowed leakage current of said one transistor in pass mode, the receiver device is prevented from switching when coming from initial-state to test-state of said input/output stage.

14. The integrated circuit according to claim 12, wherein the circuit is arranged as a combined input/output stage of a semiconductor chip having a driving P-device comprising a plurality of P-type transistors and a driving N-device comprising a second plurality of N-type transistors, said driving P-device and said driving N-device being connected in series between a first voltage level and a second voltage level, said drive devices driving high, low, and HZ states to a terminal pad connecting off from the semiconductor chip, the circuit further comprising a receiver device connected in parallel to said terminal pad, wherein when an electrical resistance of one of said first and second transistors in pass mode is implemented as R=VL/Ileak (max), where R represents the electrical resistance of said one transistor in pass mode, VL represents a voltage at said pad terminal, and Ileak (max) represents a maximum allowed leakage current of said one transistor in pass mode, the receiver device is prevented from switching when coming from lower resistance values associated with the pass mode of said input/output stage.

15. The integrated circuit according to claim 10, wherein the circuit is used in a semiconductor chip.

16. The integrated circuit according to claim 10, wherein the circuit is used in a semiconductor chip module.

17. The integrated circuit according to claim 10, wherein the circuit is used in a semiconductor multi-chip module.

18. The integrated circuit according to claim 10, wherein the circuit is used in a printed circuit board.

19. A computer program product for execution in a data processing system comprising computer program code portions for performing respective steps of a method for qualifying a leakage current to be tolerable, the leakage current being present in a first test area of an integrated circuit, when said computer program code portions are executed on a computer, the method comprising the steps of:

a) providing a first node coupled to said first test area, a second node coupled to a predefined voltage potential, and a receiver device having an input, an output and a threshold voltage level associated with the input for switching the output from a first state to a second state, b) shutting off any operational current flow into said first test area, c) generating a first voltage level at said first node corresponding to said leakage current, and d) qualifying said leakage current as tolerable when said first voltage level is between the threshold voltage level and the predefined voltage potential.

20. A computer program product stored on a computer usable medium comprising computer readable program code portions for causing a computer to perform a method for qualifying a leakage current to be tolerable, the leakage current being present in a first test area of an integrated circuit, when said computer readable program code portions are executed on a computer, the method comprising the steps of:

a) providing a first node coupled to said first test area, a second node coupled to a predefined voltage potential, and a receiver device having an input, an output and a threshold voltage level associated with the input for switching the output from a first state to a second state, b) shutting off any operational current flow into said first test area, c) generating a first voltage level at said first node corresponding to said leakage current, and e) qualifying said leakage current as tolerable when said first voltage level is between the threshold voltage level and the predefined voltage potential.

* * * * *